United States Patent
Hwang et al.

(10) Patent No.: US 8,493,803 B2
(45) Date of Patent: *Jul. 23, 2013

(54) AUTO-PRECHARGE SIGNAL GENERATOR

(75) Inventors: Sun Young Hwang, Seoul (KR); Yin Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/410,859

(22) Filed: Mar. 2, 2012

(65) Prior Publication Data

US 2012/0163100 A1  Jun. 28, 2012

Related U.S. Application Data

(63) Continuation of application No. 12/631,027, filed on Dec. 4, 2009, now Pat. No. 8,154,937.

(30) Foreign Application Priority Data

Dec. 5, 2008 (KR) .................. 10-2008-0123543

(51) Int. Cl.
*G11C 7/00* (2006.01)
(52) U.S. Cl.
USPC ........................... 365/203; 365/191; 365/194
(58) Field of Classification Search
USPC .......................................... 365/203
See application file for complete search history.

(56) References Cited

U.S. PATENT DOCUMENTS

| 7,057,953 B2 | 6/2006 | Lee |
| 7,355,912 B2 | 4/2008 | Park et al. |
| 8,154,937 B2 * | 4/2012 | Hwang et al. ................ 365/203 |
| 2008/0056038 A1 | 3/2008 | Jeong |

FOREIGN PATENT DOCUMENTS

| KR | 1019990004105 A | 1/1999 |
| KR | 1020080083797 A | 9/2008 |

OTHER PUBLICATIONS

USPTO NOA mailed Dec. 9, 2011 in connection with U.S. Appl. No. 12/631,027.

* cited by examiner

*Primary Examiner* — Son Mai
(74) *Attorney, Agent, or Firm* — Ladas & Parry LLP (57) ABSTRACT

An auto-precharge signal generation circuit comprises a signal generator, a set signal generator, and an auto-precharge signal generator. The signal generator is configured to generating a control signal and a precharge control signal in response to receiving a first column address strobe signal and an auto-precharge flag signal. The set signal generator is configured to generating a set signal in response to receiving the control signal and the precharge control signal. The auto-precharge signal generator is configured to generate an auto-precharge signal in response to receiving the set signal and a period set signal.

9 Claims, 7 Drawing Sheets

AUTO-PRECHARGE SIGNAL GENERATOR

CROSS-REFERENCES TO RELATED PATENT APPLICATION

The present application claims priority to Korean application number 10-2008-0123543, issued on Dec. 5, 2008, which is incorporated by reference in its entirety.

TECHNICAL FIELD

This disclosure relates to an auto-precharge signal generation circuit.

BACKGROUND

In operations of dynamic random access memories, when an input of a write-with-auto-precharge (hereinafter, referred to as "WTA") or read-with-auto-precharge (hereinafter, referred to as "RTA") command occurs, the memory is automatically precharged after performing the respective reading or writing operations.

Figure 1:
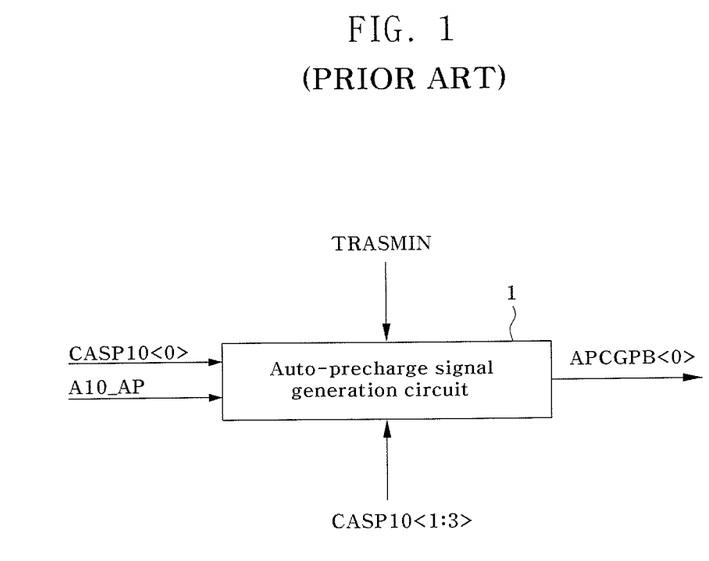
FIG. 1 is a block diagram illustrating a general auto-precharge signal generator of a semiconductor memory device.

FIG. 1 illustrates a general auto-precharge signal generation circuit of a semiconductor memory device in a block diagram. As shown in FIG. 1, the auto-precharge signal generation circuit 1 receives a period set signal TRASMIN, a first column address strobe signal CASP10<0> and an auto-precharge flag signal A10_AP and generates a first auto-precharge signal APCGPB<0> for automatically precharging a first bank BANK<0> (not shown). The period set signal TRASMIN is provided to define a period for executing a reading or writing operation to the first bank BANK<0> (not shown) in response to the RTA or WTA command and for generating the first auto-precharge signal APCGPB<0> that automatically precharges the first bank BANK<0> (not shown). The first column address strobe signal CASP10<0> is generated in a pulse form for the reading and writing operation to the first bank BANK<0> (not shown). The auto-precharge flag signal A10_AP is enabled when in a high level state for automatically precharging all banks of the semiconductor memory device.

Figure 2:
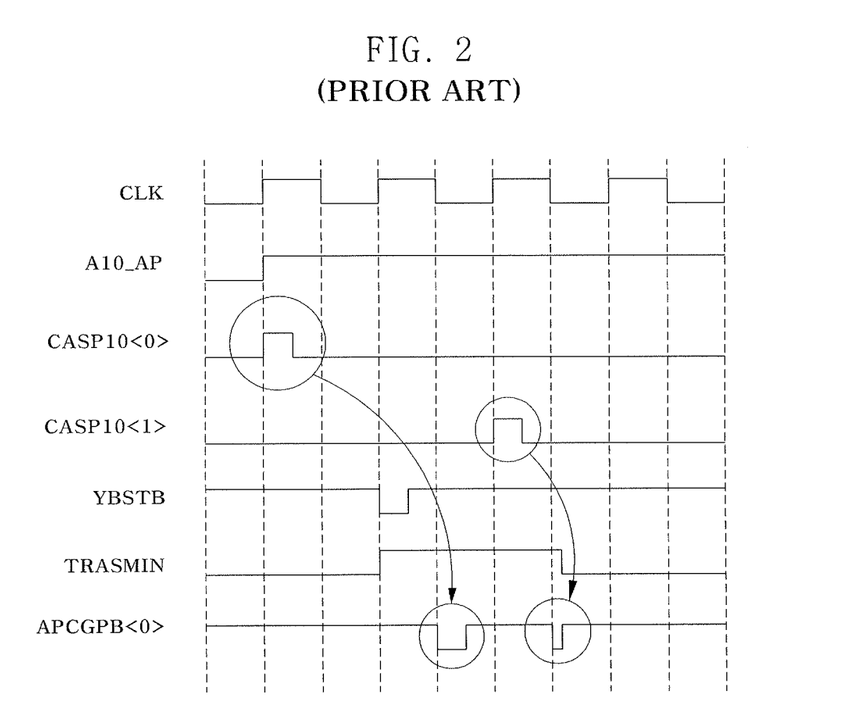
FIG. 2 is a timing diagram illustrating an internal operation of the auto-precharge signal generation circuit shown in FIG. 1.

The auto-precharge signal generation circuit 1 operates as shown in the timing diagram of FIG. 2.

Referring to FIG. 2, if the first column address strobe signal CASP10<0> is applied to the circuit in a pulse form and the auto-precharge signal goes into a high level state, then the first auto-precharge signal APCGPB<0> is subsequently generated with a pulse for automatically precharging the first bank BANK<0> (not shown) that has been read or written when the period set signal TRASMIN is enabled in a high level state.

However, the pulse of the first auto-precharge signal APCGPB<0> is even generated when there is an input of a pulse from second through fourth column address strobe signals CASP10<1>, CASP10<2> (not shown), CASP10<3> (not shown), as well as, the first column address strobe signal CASP10<0>. As a result a malfunction can occur when in the reading or writing operation modes of the semiconductor memory device.

In further detail about this problem, if the second column address strobe signal CASP10<1> succeeds the first column address strobe signal CASP10<0> (i.e., CASP10<1> is continuously applied to the auto-precharge signal generation circuit 1 after CASP10<0> is applied thereto), a second pulse of the first auto-precharge signal APCGPB<0> can be inadvertently generated while the period set signal TRASMIN is enabled in the high level state. However, as shown in FIG. 2, the second pulse of the first auto-precharge signal APCGPB<0> can be generated in an abnormal pattern due to insufficiency of a time margin from the period set signal TRASMIN, which results in hindering the auto-precharge signal generation circuit 1 from being reset. This phenomenon incurs malfunctions of the auto-precharge signal generation circuit 1 in the reading or writing operation.

SUMMARY

There is provided an auto-precharge signal generation circuit, comprising: a signal generator receiving a first column address strobe signal and an auto-precharge flag signal and generating a control signal and a precharge control signal; a set signal generator receiving the control signal and the precharge control signal and generating a set signal; and an auto-precharge signal generator receiving the set signal and a period set signal and generating an auto-precharge signal. The signal generator may generate the control signal by delaying a signal, which is driven in a predetermined level from a time of enabling the first column address strobe signal and the auto-precharge flag signal until a time of enabling the set signal, in a predetermined period of an internal clock signal.

According to an embodiment, the precharge control signal may be enabled if the control signal is enabled and a burst operation is terminated.

According to an embodiment, the precharge control signal may be enabled if the control signal is enabled and second through fourth column address strobe signals are enabled.

According to an embodiment, the signal generator may comprise: a driver receiving the first column address strobe signal and the auto-precharge flag signal and driving a first node; an initializing device receiving the set signal and initializing the first node; a delay circuit delaying a signal of the first node in the predetermined period of the internal clock signal and generating the control signal; a latch circuit latching the control signal; an enable control signal generator receiving second through fourth column address strobe signals and a burst end signal and generating an enable control signal; and a logic circuit executing a logical operation with an output signal of the latch circuit and the enable control signal and generating the precharge control signal.

According to an embodiment, the driver may comprise: a logic device executing a logical operation with the first column address strobe signal and an inverted signal of the auto-precharge flag signal; a pull-up device connected between a power supply terminal and the first node and pulling up the first node in response to a signal of the logic circuit; a first pull-down device pulling down the first node in response to the first column address strobe signal; and a second pull-down device turned on in response to the auto-precharge flag signal.

According to an embodiment, the enable control signal generator may comprise: a first logic device executing a logical operation with the second through fourth column address strobe signals; and a second logic device executing a logical operation with the burst end signal and a signal of the first logic device.

According to an embodiment, the set signal generator may comprise: a driver driving a first node in response to the precharge control signal by the control signal; a delay circuit delaying a signal of the first node in the predetermined period of the internal clock signal; and a pulse controller adjusting a pulse width of a signal transferred from the delay circuit and generating the set signal.

According to an embodiment, the driver may comprise: a pull-up device connected between a power supply terminal and the first node and pulling up the first node in response to the precharge control signal; and a pull-down circuit pulling down the first node in response to the precharge control signal and the control signal.

According to an embodiment, the pull-down circuit may comprise: a first pull-down device pulling down the first node in response to the precharge control signal; and a second pull-down device turned on in response to the control signal.

According to an embodiment, the pulse controller may comprise: a delay line delaying an output signal of the delay circuit in a predetermined period; and a logic device executing a logical operation with a signal of the delay line and the output signal of the delay circuit.

According to an embodiment, the auto-precharge signal generator may generate the auto-precharge signal enabled in response to the set signal while the set period set signal is being enabled.

According to an embodiment, the auto-precharge signal generator may comprise: a latch latching and outputting the set signal to a first node; a logic circuit executing a logical operation with a signal of the first node and the period set signal; and a pulse controller adjusting a pulse width of a signal transferred from the logic circuit and generating the auto-precharge signal.

According to an embodiment, the latch may be a NAND-gate latch.

According to an embodiment, the pulse controller may comprise: a delay line delaying an output signal of the logic circuit in a predetermined period; and a logic device executing a logical operation with a signal of the delay line and the output signal of the logic circuit.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED
EMBODIMENTS

Hereinafter, embodiments of the present invention will be described with reference to accompanying drawings. However, the embodiments are for illustrative purposes only and are not intend to limit the scope of the invention.

An embodiment of the present invention may be applicable to a memory cell array with 4-bank structure (four memory banks are respectively called first, second, third and fourth banks BANK<0:3>) in a semiconductor memory device. If a WTA (i.e., write-with-auto-precharge) or RTA (i.e., read-with-auto-precharge) command is input to the semiconductor memory device, then the first through fourth auto-precharge signal generation circuits respectively generate first through fourth auto-precharge signals APCGPB<0:3>, for respectively precharging the banks BANK<0:3>, in response to first through fourth column strobe signals CASP10<0:3>. The first through fourth auto-precharge signal generation circuits respective to the auto-precharge signals APCGPB<0:3> are same or essentially the same with respect to each other in circuit configuration. Accordingly, in this description, only the first auto-precharge signal generation circuit for the first auto-precharge signal APCGPB<0> will be illustrated and explained as follows.

Figure 3:
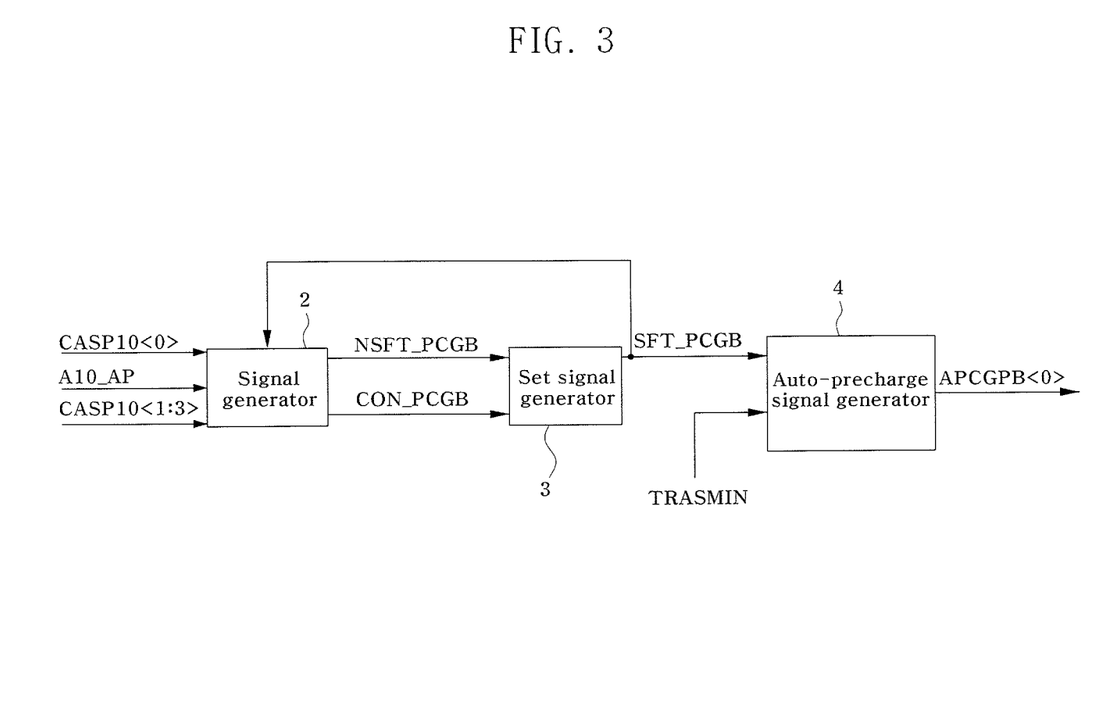
FIG. 3 is a block diagram illustrating a configuration of an auto-precharge signal generation circuit according to an embodiment of the present invention.

FIG. 3 illustrates a functional block configuration of an auto-precharge signal generation circuit according to an embodiment of the present invention.

As shown in FIG. 3, the auto-precharge signal generation circuit is functionally comprised of a signal generator 2, a set signal generator 3 and an auto-precharge signal generator 4.

Figure 4:
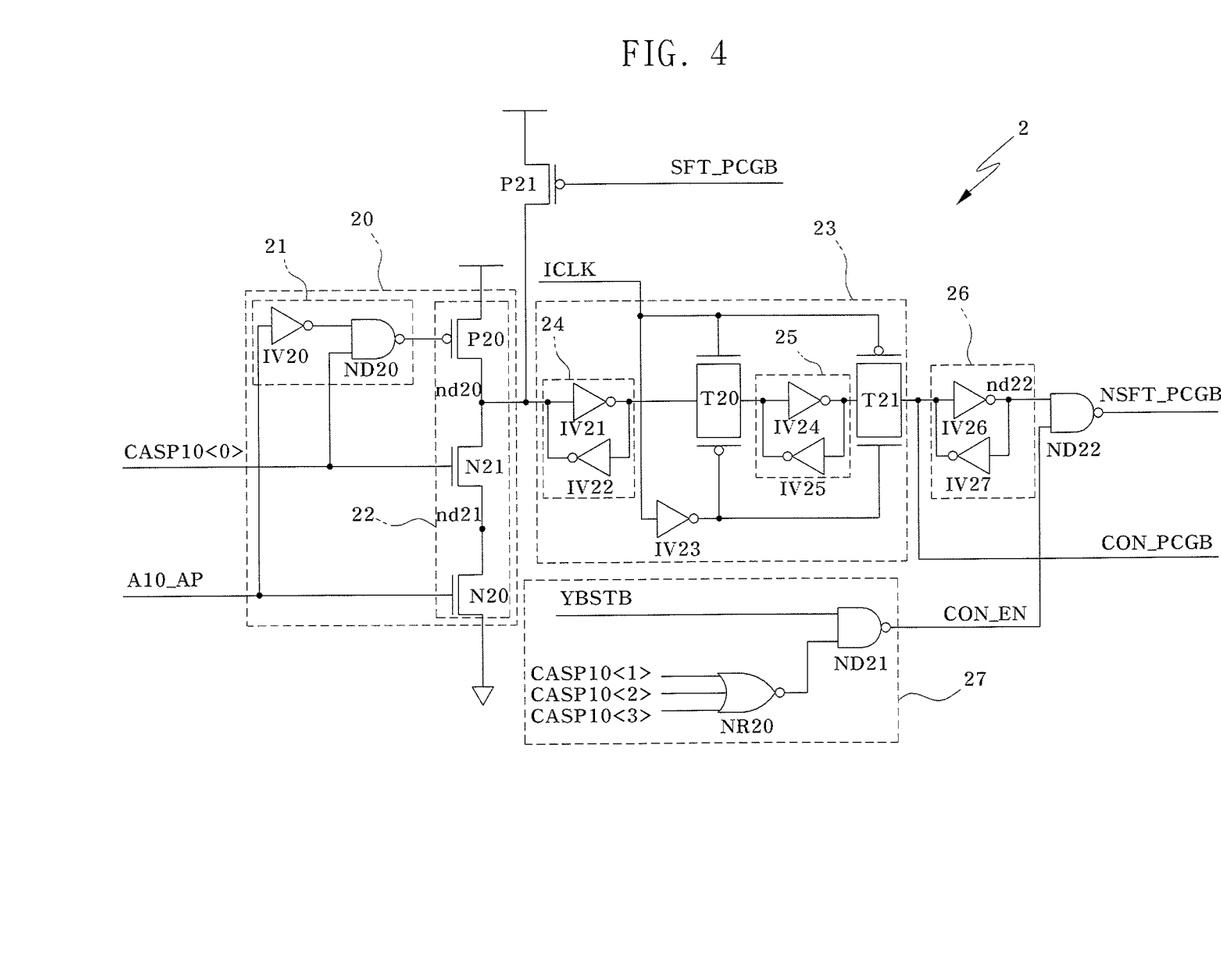
FIG. 4 is a circuit diagram illustrating a signal generation circuit of the auto-precharge signal generation circuit shown in FIG. 3.

Referring to FIGS. 3 and 4, the signal generator 2 is exemplarily formed to comprise a first driver 20, a PMOS transistor P21 pulling up and initializing a node nd20 to a high level state in response to a set signal SFT_PCGB that is fed back from the set signal generator 3, a first delay circuit 23, a latch circuit 26 temporarily holding a control signal CON_PCGB, an enable control signal generator 27, and a NAND gate ND22 outputting a precharge control signal NSFT_PCGB through a not-AND operation that uses an output signal of the latch circuit and an enable control signal CON_EN.

The first driver 20 is composed of a first logic circuit 21 and a signal drive circuit 22. The first logic circuit 21 is composed of an inverter receiving an auto-precharge flag signal A10_AP, and a NAND gate ND20 executing a not-AND operation using an inverted signal of the auto-precharge flag signal A10_AP and the first column address strobe signal CASP10<0>. The auto-precharge flag signal A10_AP is enabled in a high level state to automatically precharge all banks of the semiconductor memory device. The first column address strobe signal CASP10<0> is generated with a pulse associated with a either a reading or writing operation to the first bank BANK<0> (not shown).

The signal drive circuit 22 is composed of a PMOS transistor P20, an NMOS transistor N20, and an NMOS transistor N21. The N21 PMOS transistor P20 is configured to pull-up the node nd20 in response to an output signal of the first logic circuit 21. The NMOS transistor N21 is connected between the node nd20 and a node nd21 and is configured to pull-down the node nd20 in response to the first column address strobe signal CASP10<0>. The NMOS transistor N20 is connected between the node nd21 and the ground voltage terminal VSS and is configured to be turned on in response to the auto-precharge flag signal A10_AP.

With this configuration, the first driver 20 functions to pull-down the node nd20 to a low level through the NMOS transistors N20 and N21 that are turned on when the first column address strobe signal CASP10<0> is applied thereto by a pulse and when the auto-precharge flag signal A10_AP goes into a high level state, i.e., when the WTA or RTA command for the first bank BANK<0> (not shown) is input to the semiconductor memory device.

The first delay circuit 23 is composed of transmission gates T20 and T21, and latches 24 and 25. From the first delay circuit 23, a signal of the node nd20 is delayed for a predetermined time and output as the control signal CON_PCGB by way of the transmission gates T20 and T21 that operate in sync with an internal clock signal ICLK. In other words, the transmission gate T20 of the first delay circuit 23 is turned on in sync with a rising edge of the internal clock signal ICLK and the transmission gate T21 of the first delay circuit 23 is turned on in sync with a falling edge of the internal clock signal ICLK. Thus, when a level transition of the node nd20 occurs, a signal of the node nd20 is output as the control signal CON_PCGB in response to the falling edge of the internal clock signal ICLK subsequent to the level transition of the node nd20. Here, the internal clock signal ICLK is generated by buffing a clock signal through a clock buffer (not shown).

The enable control signal generator 27 is composed of a NOR gate NR20 and a NAND gate ND21. The NOR gate NR20 is configured to execute a not-OR operation using the second through fourth column address strobe signals CASP10<1:3>. The NAND gate ND21 is configured to output the enable control signal CON_EN through a not-AND operation using a burst end signal YBSTB and an output signal of the NOR gate NR20. Here, the burst end signal YBSTB is enabled in a low level state after the reading or writing operation of the first bank BANK<0> (not shown). The second through fourth column address strobe signals CASP10<1:3> are generated with pulses for the reading or writing operations of the second through fourth banks BANK<1:3> (not shown). The enable control signal CON_EN provided from the enable control signal generator 27 is enabled in a high level state when the burst end signal YBSTB is enabled in a low level state or when at least one of the second through fourth column address strobe signals CASP<1:3> is enabled in a high level state.

From the signal generator with this configuration, the precharge control signal NSFT_PCGB is generated with a pulse that is enabled in a low level when the burst end signal YBSTB is enabled in a low level state, or when one of the second through fourth column address strobe signals CASP<1:3> is enabled in a high level state, when the WTA or RTA command has been input for the first bank BANK<0> (not shown).

Figure 5:
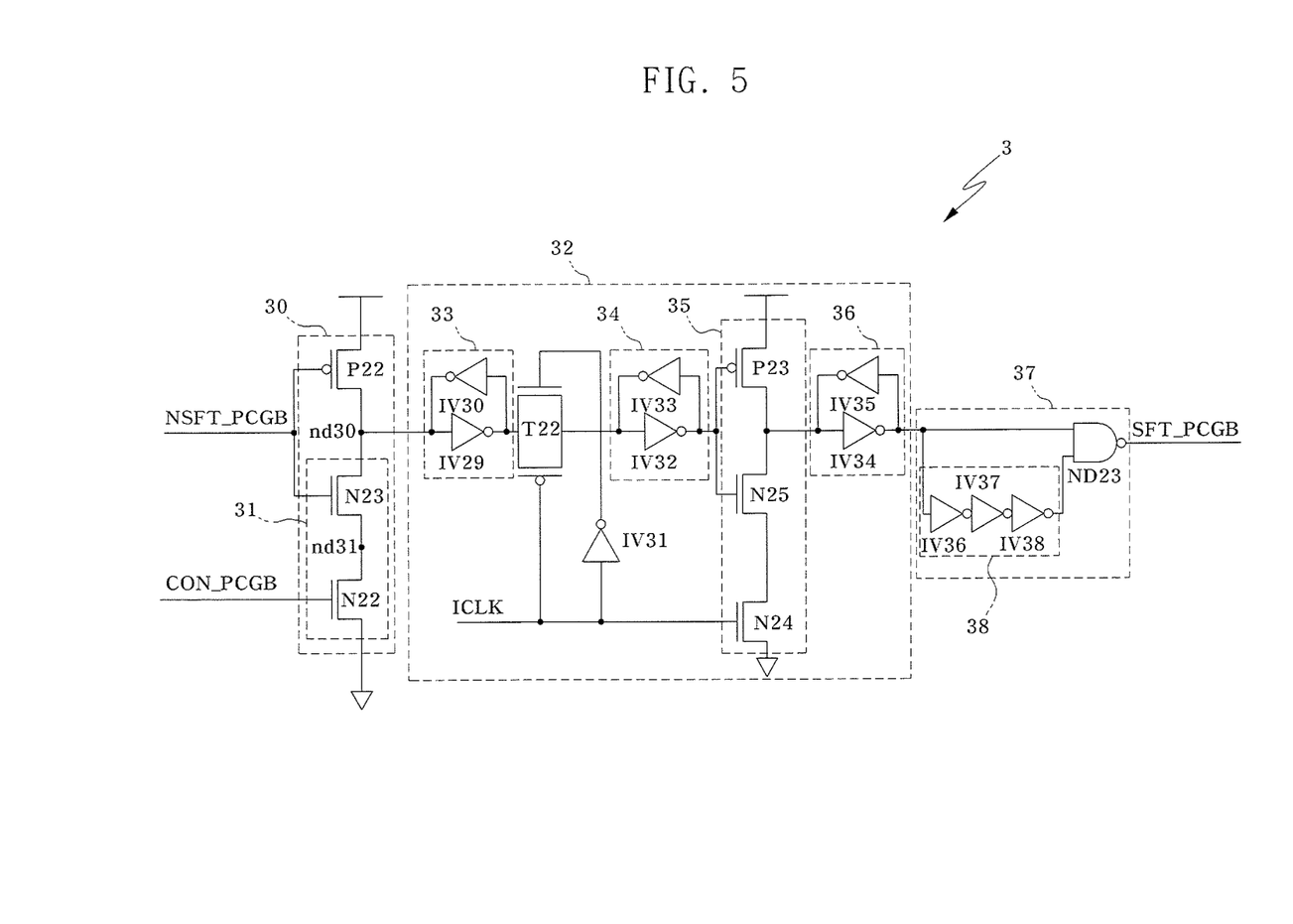
FIG. 5 is a circuit diagram illustrating a set signal generator of the auto-precharge signal generation circuit shown in FIG. 3.

Referring to FIG. 5, the set signal generator 3 is exemplarily formed to comprise a second driver 30, a second delay circuit 32 and a first pulse controller 37.

The second driver 30 is composed of a PMOS transistor P22 and a pull-down circuit 31. The PMOS transistor P22 is configured to be turned on to pull-up a node nd30 in response to the precharge control signal NSFT_PCGB. The pull-down circuit 31 is configured to pull-down the node nd30 in response to the precharge control signal NSFT_PCGB and the control signal CON_PCGB. The pull-down circuit 31 is composed of an NMOS transistor N23, and an NMOS transistor N22. The NMOS transistor N23 is connected between the node nd30 and a node nd31 and is configured to be turned on to pull-down the node nd30 in response to the precharge control signal NSFT_PCGB. The NMOS transistor N22 is connected between the node nd31 and the ground voltage terminal VSS and is configured to be turned on in response to the control signal CON_PCGB.

With this configuration, the second driver operates to drive the node nd30 in response to the precharge control signal NSFT_PCGB while the control signal CON_PCGB is being enabled in a low level state. In further detail, if the precharge control signal NSFT_PCGB is input in a low level state, the PMOS transistor P22 is turned on to pull-up the node nd30. If the precharge control signal NSFT_PCGB is input in a high level, the NMOS transistor P23 is turned on to pull-down the node nd30. Meanwhile, in the condition that the control signal CON_PCGB is disabled in a high level state, the second driver 30 cannot pull-down the node nd30, but just pull-up the node nd30 in response to a pulse of the precharge control signal NSFT_PCGB.

The second delay circuit 32 is composed of latches 33, 34 and 36, a transmission gate T22 and a buffer circuit 35. The transmission gate T22 is turned on in sync with a falling edge of the internal clock signal ICLK. The buffer circuit 35 is driven in sync with a rising edge of the internal clock signal ICLK. If there is a level transition on the node nd30, a signal of the node nd30 is output at the rising edge of the internal clock signal ICLK after the level transition of the node nd30. In other words, the second delay circuit 32 delays the signal of the node nd30 by a predetermined time in sync with the internal clock signal ICLK.

The first pulse controller 37 is composed of a first delay line 38 formed of a chain of odd-numbered inverters IV36, IV37 and IV38 and inversely delaying an output signal of the second delay circuit 32 in a predetermined time, and a NAND gate ND23 outputting a set signal SFT_PCGB by executing a not-AND operation with an output signal of the second delay circuit 32 and a signal of the first delay line 38. The first pulse controller 37 generates the set signal SFT_PCGB by adjusting a pulse width of the output signal of the second delay circuit 32. The set signal SFT_PCGB is generated in a low level state from the time at which the output signal of the second delay circuit 32 goes to a high level state until the delay period of the first delay line 38 is consumed.

Figure 6:
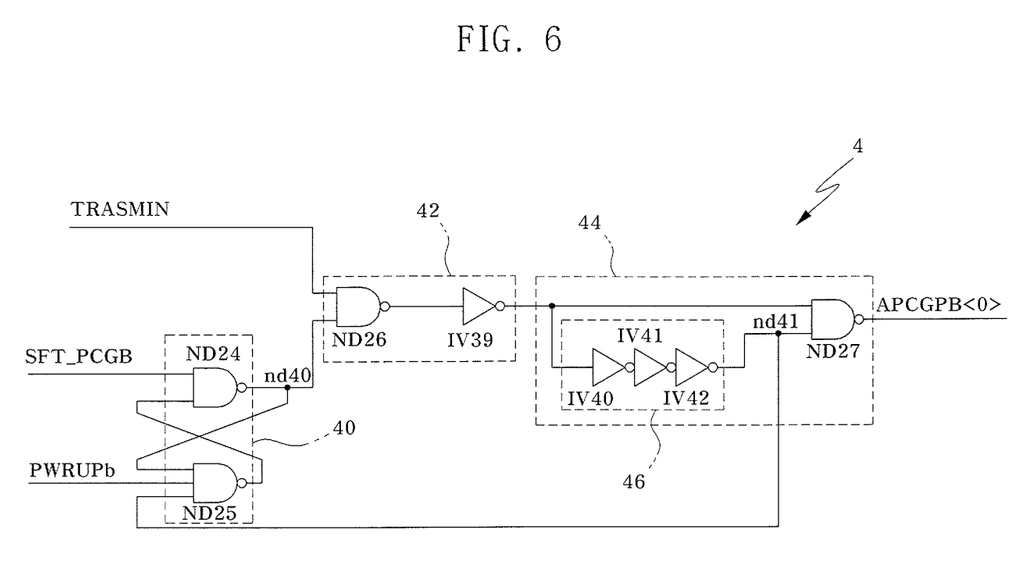
FIG. 6 is a circuit diagram illustrating an auto-precharge signal generator of the auto-precharge signal generation circuit shown in FIG. 3.
Figure 7:
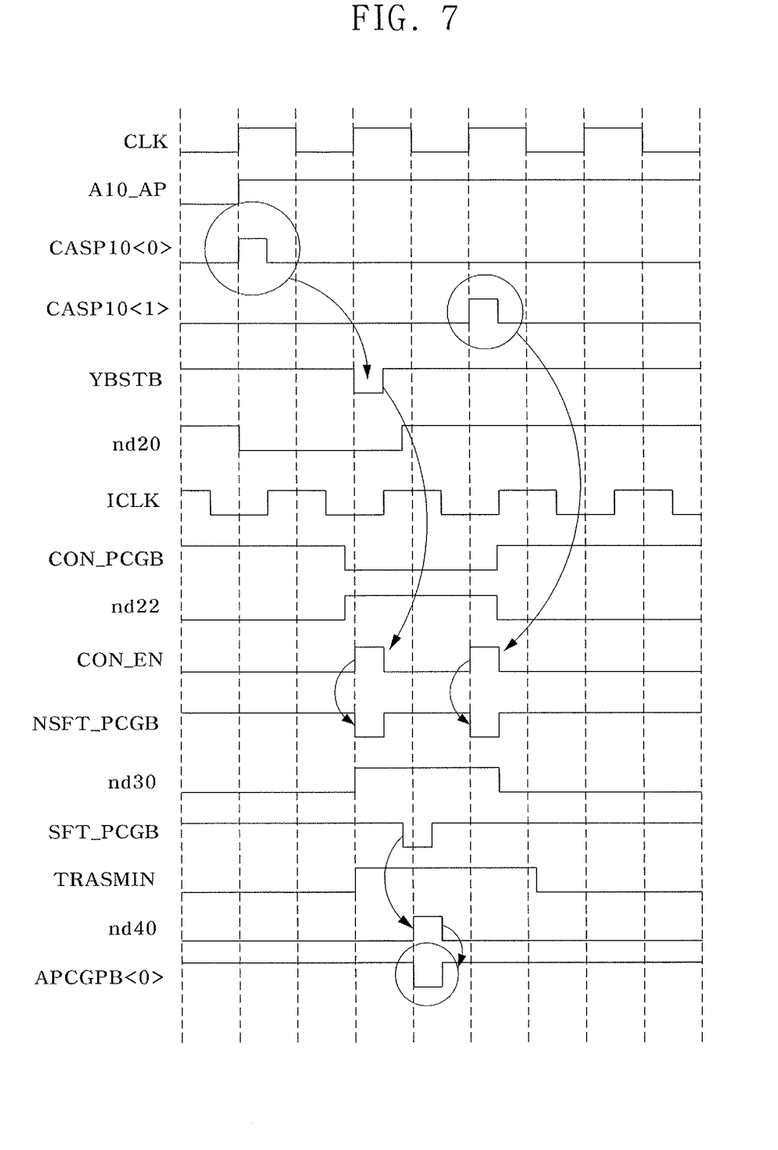
FIG. 7 is a timing diagram illustrating an internal operation of the auto-precharge signal generation circuit shown in FIG. 3.

Referring to FIG. 6, the auto-precharge signal generator 4 comprises a NAND-gate latch 40, a second logic circuit 42 and a second pulse controller 44.

The NAND-gate latch 40 is composed of a NAND gate ND24, and a NAND gate ND25. The NAND gate ND24 is configured to set a node nd40 on a high level state in response to the set signal SFT_PCGB. The NAND gate ND25 is configured to reset the node nd40 on a low level state in response to a power-up signal PWRUPb, which is enabled in a low level during a power-up period, and a signal of a node nd41.

The second logic circuit 42 is composed of a NAND gate executing a not-AND operation with a signal of the node nd40 and the period set signal TRASMIN, and an inverter IV39. Here, the period set signal TRASMIN is enabled in a high level in a period in which the auto-precharge signal APCG<0> is generated to automatically precharge the first bank BANK<0> after the reading or writing operation of the first bank BANK<0> in the condition of the WTA or RTA command. Therefore, the second logic circuit 42 outputs a signal of high level when the node nd40 is set on a high level while the period set signal TRASMIN is being in a high level.

The second pulse controller 44 is composed of a second delay line 46 and a NAND gate ND27. The second delay line 46 may be formed of a chain of odd-numbered inverters IV40, IV41 and IV42 and is configured to inversely delaying an output signal of the second delay circuit 42 at a predetermined time. The NAND gate ND27 is configured to output the first auto-precharge signal APCGPB<0> by executing a not-AND operation with an output signal of the second delay circuit 42 and a signal of the second delay line 46. The second pulse controller 44 generates the first auto-precharge signal APCGPB<0> by adjusting a pulse width of the output signal of the second delay circuit 42. A pulse of the first auto-precharge signal APCGPB<0> continues from the time at which the output signal of the second delay circuit 42 goes to a high level state until the delay period of the second delay line 46 is consumed.

In describing an operation of the auto-precharge signal generation circuit configured as aforementioned, the timing diagram of FIG. 1 will be referred in an exemplary condition that a read or write command for the second bank BANK<1> is continuously input to the semiconductor memory device after an input of the WTA or RTA command (i.e., WTA or RTA mode) for the first bank BANK<0> (not shown).

First, the signal generator 2 outputs a pulse of the precharge control signal NSFT_PCGB if a pulse of the burst end signal YBSTB is applied thereto after the reading or writing operation for the first bank BANK<0> (not shown) since the input of the WTA or RTA mode to the first bank BANK<0> (not shown) begins.

In further detail, if the WTA or RTA mode to the first bank BANK<0> (not shown) begins, the first column address strobe signal CASP10<0> is generated in a pulse and the auto-precharge flag signal A10_AP goes into a high level state. As a result, the NMOS transistors N20 and N21 are turned on to pull-down the node nd20. The signal of the node nd20 is delayed through the first delay circuit 23 by a predetermined time in sync with the internal clock signal ICLK and transferred as the control signal CON_PCGB. Then, the control signal CON_PCGB goes to a low level state in sync with an falling edge of the internal clock signal ICLK after the node nd20 is pulled down to a low level state.

After the control signal CON_PCGB transitions to a low level state, if the burst end signal YBSTB is applied with a pulse to the signal generator 2 by termination of the reading or writing operation, then the enable control signal generator 27 outputs a pulse of the enable control signal CON_EN activated in a high level state for a predetermined period. Since the node nd22 goes to a high level state by the control signal CON_PCGB of low level state, then the precharge control signal NSFT_PCGB from the NAND gate ND22 becomes an inverted signal of the enable control signal CON_EN as a pulse that is enabled in a low level state for a predetermined period.

Additionally, the signal generator 2 is configured to provide a pulse of the precharge control signal NSFT_PCGB even if there is an input of a read or write command for the second bank BANK<1> (not shown). In detail, if the second column address strobe signal CASP10<1> is applied to the signal generator 2 as a pulse in response to the read or write command for the second bank BANK<1> (not shown) while the control signal CON_PCGB is being in a low level state, then the enable control signal generator 27 outputs a pulse of the enable control signal CON_EN that is activated in a high level state for a predetermined period. Since the node nd22 goes to a high level state by the control signal CON_PCGB of low level, the precharge control signal NSFT_PCGB from the NAND gate ND22 becomes an inverted signal of the enable control signal CON_EN as a pulse that is enabled in a low level state for a predetermined period.

Summarizing from the aforementioned, the signal generator 2 provides two pulses of the precharge control signal NSFT_PCGB when a read or write command for the second bank BANK<1> (not shown) follows after an input of the WTA or RTA command for the first bank BANK<0> (not shown). Further, the control signal CON_PCGB from the signal generator 2 is maintained on a low level state during the period when the precharge control signal NSFT_PCGB is generated with a pulse.

Next, the set signal generator 3 outputs the set signal SFT_PCGB from the precharge control signal NSFT_PCGB in response to the control signal CON_PCGB. As stated above, since the NMOS transistor N22 is held in its turn-off state by the control signal CON_PCGB of low level state in the period for which the precharge control signal NSFT_PCGB is generated with a pulse, then the node nd30 is driven into a high level state when the first pulse of the precharge control signal NSFT_PCGB is input to the set signal generator 3. This high level state of the node nd30 is maintained until the control signal CON_PCGB turns to a high level state. In other words, the set signal generator 3 drives the node nd30 in response only to the first pulse of the precharge control signal NSFT_PCGB, but maintaining the status of the node nd30 regardless of the next pulse of the precharge control signal NSFT_PCGB.

As such, a signal of the node nd30 pulled up by the first pulse of the precharge control signal NSFT_PCGB is output through the second delay circuit 32 with a predetermined delay time in sync with rising and falling edges of the internal clock signal ICLK. The first pulse controller 37 receives an output signal of the second delay circuit 32 and outputs the set signal SFT_PCGB. As mentioned above, the set signal SFT_PCGB is generated in a low level state from the time at which the output signal of the second delay circuit 32 goes to a high level state until the delay period of the first delay line 38 is consumed.

Afterward, the auto-precharge signal generator 4 receives the enabled set signal SFT_PCGB at a low level state and generates a pulse of the first auto-precharge signal APCGPB<0>. If the node nd40 is set on a high level state by the set signal SFT_PCGB of low level state while the period set signal TRASMIN is being in a high level state, the second logic circuit 42 outputs a high level signal and the second pulse controller 44 outputs a pulse of the first auto-precharge signal APCGPB<0>. During this, the pulse of the first auto-precharge signal APCGPB<0> output from the second pulse controller 44 is generated in a low level state from the time at which the output signal of the second delay circuit 42 goes to a high level state until the delay period of the second delay line 46 is consumed.

In the meantime, the set signal SFT_PCGB enabled in a low level state makes the node nd20 of the signal drive circuit 22 initialized to a high level state to transition the control signal CON_PCGB into a high level.

In Summary, the auto-precharge signal generation circuit according to the embodiment of the present invention is configured and operates to make the set signal SFT_PCGB generated only by an input of a WTA or RTA command for the first bank BANK<0> (not shown) in an active period of the control signal CON_PCGB, but preventing the set signal SFT_PCGB from being further generated by a succeeding WTA or RTA command for the second bank BANK<1> (not shown). Therefore, even though the WTA or RTA command for the first bank BANK<0> (not shown) is successively followed by the next WTA or RTA command for the second bank BANK<1> (not shown), the pulse of the first auto-precharge signal APCGPB<0> is controlled to appear only once. In other words, an input of the WTA or RTA command for the first bank BANK<0> (not shown) just causes the first auto-precharge signal APCGPB<0> to be generated only in a single pulse. As described above, by interrupting the first auto-precharge signal APCGPB<0> from responding to a WTA or RTA command of the second bank BANK<1> (not shown) after an input of a WTA or RTA command of the first bank BANK<0> (not shown), the auto-precharge signal generation circuit according to the embodiment of the present invention is effective in preventing a malfunction from an unstable generation of the first auto-precharge signal APCGPB<0> due to an insufficient time margin of the period set signal TRASMIN.

While the present invention has been described with respect to the specific embodiments, it will be apparent to those skilled in the art that various changes and modifications may be made without departing from the spirit and scope of the invention as defined in the following claims.

What is claimed is:

1. An auto-precharge signal generation circuit comprising:
   a set signal generator configured to generate a set signal in response to receiving a control signal and a precharge control signal; and
   an auto-precharge signal generator configured to generate an auto-precharge signal in response to receiving the set signal and a period set signal,
   wherein the control signal is generated by delaying a signal, which is driven in a predetermined level from a time of enabling a first column address strobe signal and an auto-precharge flag signal until a time of enabling the set signal, in a predetermined period of an internal clock signal, and the precharge control signal is enabled when the control signal is enabled and when a burst operation is terminated or second through fourth column address strobe signals are enabled.

2. The auto-precharge signal generation circuit of claim 1, wherein the set signal generator comprises:
   a driver configured to drive a first node in response to the precharge control signal using the control signal;
   a delay circuit configured to delay a signal of the first node in the predetermined period of the internal clock signal; and
   a pulse controller configured to adjust a pulse width of a signal transferred from the delay circuit and generate the set signal.

3. The auto-precharge signal generation circuit of claim 2, wherein the driver comprises:
   a pull-up device connected between a power supply terminal and the first node, wherein the pull-up device is configured to pull-up the first node in response to the precharge control signal; and
   a pull-down circuit configured to pull-down the first node in response to the precharge control signal and the control signal.

4. The auto-precharge signal generation circuit of claim 3, wherein the pull-down circuit comprises:
   a first pull-down device configured to pull-down the first node in response to the precharge control signal; and
   a second pull-down device configured to turn on in response to the control signal.

5. The auto-precharge signal generation circuit of claim 2, wherein the pulse controller comprises:
   a delay line configured to delay an output signal of the delay circuit for a predetermined period; and
   a logic device configured to execute a logical operation using a signal of the delay line and the output signal of the delay circuit.

6. The auto-precharge signal generation circuit of claim 1, wherein the auto-precharge signal generator generates the auto-precharge signal enabled in response to the set signal while the period set signal is being enabled.

7. The auto-precharge signal generation circuit of claim 6, wherein the auto-precharge signal generator comprises:
   a latch configured to latch and output the set signal to a first node;
   a logic circuit configured to execute a logical operation with a signal of the first node and the period set signal; and
   a pulse controller configured to adjust a pulse width of a signal transferred from the logic circuit and generate the auto-precharge signal.

8. The auto-precharge signal generation circuit of claim 7, wherein the latch is a NAND-gate latch.

9. The auto-precharge signal generation circuit of claim 7, wherein the pulse controller comprises:
   a delay line configured to delay an output signal of the logic circuit at a predetermined period; and
   a logic device configured to execute a logical operation using a signal of the delay line and the output signal of the logic circuit.

* * * * *